United States Patent
Clements

(10) Patent No.: US 10,705,287 B2
(45) Date of Patent: Jul. 7, 2020

(54) EDGELIT LIGHTING SYSTEM

(71) Applicant: Eaton Intelligent Power Limited, Dublin (IE)

(72) Inventor: RUss Clements, Atlanta, GA (US)

(73) Assignee: Signify Holding B.V., Eindhoven (NL)

( * ) Notice: Subject to any disclaimer, the term of this patent is extended or adjusted under 35 U.S.C. 154(b) by 27 days.

(21) Appl. No.: 15/985,197

(22) Filed: May 21, 2018

(65) Prior Publication Data

US 2018/0267232 A1 Sep. 20, 2018

Related U.S. Application Data

(63) Continuation of application No. 15/607,207, filed on May 26, 2017, now Pat. No. 9,977,174, which is a
(Continued)

(51) Int. Cl.
*F21V 8/00* (2006.01)
*H01L 31/18* (2006.01)
(Continued)

(52) U.S. Cl.
CPC ............. *G02B 6/0075* (2013.01); *F21S 8/04* (2013.01); *F21V 7/0008* (2013.01); *F21V 17/16* (2013.01);
(Continued)

(58) Field of Classification Search
CPC .. G02B 6/0031; G02B 6/0055; G02B 6/0075; G02B 6/0078
See application file for complete search history.

(56) References Cited

U.S. PATENT DOCUMENTS

D85,382 S 10/1931 Guth
D122,236 S 8/1940 Scribner
(Continued)

FOREIGN PATENT DOCUMENTS

WO WO 2012030387 3/2012
WO WO 2012158723 11/2012

OTHER PUBLICATIONS

Evergreen HO T5 Fixtures, image post date Nov. 3, 2014, site visited Sep. 8, 2015, (online), <http://www.t5fixtures.com/evergreen-t5-fixtures/>.
(Continued)

*Primary Examiner* — Sean P Gramling
(74) *Attorney, Agent, or Firm* — King & Spalding LLP

(57) ABSTRACT

A lighting system can include a lightguide having an edge and two major surfaces. The lightguide can be mounted in a frame so that one of the major surfaces faces towards an area to be illuminated, while the other major surface faces away from the area. LEDs can couple light into the lightguide edge, with the coupled light emitting from both major surfaces. Light emitted from the major surface that faces away from the area to be illuminated can be reflected back into the lightguide by a reflective surface. The reflective surface can be separated from the lightguide by an air gap. The air gap can promote internal reflection at the major surface facing away from the area to be illuminated, thereby enhancing homogeneity and output of light towards the area to be illuminated. The frame can include integral wireways, reflector retention clips, and grounding circuitry.

12 Claims, 12 Drawing Sheets

Related U.S. Application Data continuation of application No. 13/832,095, filed on Mar. 15, 2013, now Pat. No. 9,666,744.

(51) Int. Cl.
*H01L 31/0352* (2006.01)
*F21S 8/04* (2006.01)
*F21V 7/00* (2006.01)
*F21V 17/16* (2006.01)
*F21Y 115/10* (2016.01)

(52) U.S. Cl.
CPC .......... *G02B 6/0011* (2013.01); *G02B 6/0046* (2013.01); *G02B 6/0055* (2013.01); *H01L 31/035281* (2013.01); *H01L 31/18* (2013.01); *F21Y 2115/10* (2016.08); *G02B 6/0068* (2013.01); *G02B 6/0073* (2013.01); *G02B 6/0083* (2013.01); *G02B 6/0088* (2013.01); *G02B 6/0091* (2013.01); *G02B 6/0095* (2013.01)

(56) References Cited

U.S. PATENT DOCUMENTS

| | | |
|---|---|---|
| D123,768 S | 12/1940 | Scribner |
| D168,974 S | 3/1953 | Spaulding |
| D195,012 S | 4/1963 | Walter |
| 3,272,978 A | 9/1966 | Jackson |
| D232,257 S | 7/1974 | Paulson |
| 4,175,360 A | 11/1979 | Mulvey |
| D260,702 S | 9/1981 | Hannula |
| D266,578 S | 10/1982 | Moshier |
| 4,561,180 A | 7/1985 | Hernandez |
| 5,040,098 A | 8/1991 | Tanaka et al. |
| 5,044,582 A | 9/1991 | Walters |
| 5,195,822 A | 3/1993 | Takahashi et al. |
| 5,355,604 A | 10/1994 | Rathke |
| 5,440,470 A | 8/1995 | Ly |
| D386,804 S | 11/1997 | Engel |
| 5,704,703 A | 1/1998 | Yamada et al. |
| 5,931,556 A | 8/1999 | Herst et al. |
| 5,934,631 A | 8/1999 | Becker |
| 6,123,438 A | 9/2000 | Hentz |
| 6,161,939 A | 12/2000 | Bansbach |
| 6,272,794 B1 | 8/2001 | Rippel |
| 6,299,327 B1 | 10/2001 | Camarota |
| D456,938 S | 5/2002 | Wardenburg |
| D459,825 S | 7/2002 | Field |
| D465,869 S | 11/2002 | Bodell |
| 6,527,422 B1 | 3/2003 | Hutchison |
| 6,595,662 B2 | 7/2003 | Wardenburg |
| D496,121 S | 9/2004 | Santoro |
| 6,945,668 B1 | 9/2005 | Orlov et al. |
| 7,131,753 B1 | 11/2006 | Edwards, Jr. |
| D543,652 S | 5/2007 | Hargreaves |
| D544,139 S | 6/2007 | Hargreaves |
| D544,983 S | 6/2007 | Hargreaves |
| D544,985 S | 6/2007 | Hargreaves |
| D544,987 S | 6/2007 | Hargreaves |
| D545,484 S | 6/2007 | Hargreaves |
| D548,386 S | 8/2007 | McDowell |
| D556,358 S | 11/2007 | Santoto |
| D572,858 S | 7/2008 | Santoto |
| D595,006 S | 6/2009 | Santoto |
| D597,241 S | 7/2009 | Fabbri et al. |
| D602,625 S | 10/2009 | Santoto |
| 7,604,379 B2 | 10/2009 | Stenback et al. |
| 7,607,793 B2 | 10/2009 | Coushaine et al. |
| D605,342 S | 12/2009 | Chung et al. |
| D608,490 S | 1/2010 | Chung et al. |
| D610,735 S | 2/2010 | Chien Wen-Hsiang |
| 7,722,208 B1 | 5/2010 | Dupre |
| 7,722,228 B2 | 5/2010 | Broer |
| D623,345 S | 9/2010 | Kung |
| D631,594 S | 1/2011 | Irvine |
| D632,419 S | 2/2011 | Ng et al. |
| D632,832 S | 2/2011 | Lown |
| D633,247 S | 2/2011 | Kong et al. |
| D634,060 S | 3/2011 | Wardenburg |
| D634,468 S | 3/2011 | Hargreaves |
| D636,112 S | 4/2011 | Chung et al. |
| D637,162 S | 5/2011 | Bridgman |
| D637,341 S | 5/2011 | Wardenburg |
| 7,963,689 B2 | 6/2011 | Lee |
| 8,038,318 B2 | 10/2011 | Plunk |
| D653,376 S | 1/2012 | Kong et al. |
| 8,128,256 B2 | 3/2012 | Kim |
| D657,488 S | 4/2012 | Lown |
| D664,699 S | 7/2012 | Nakahira et al. |
| D665,119 S | 8/2012 | Bryant |
| D667,584 S | 9/2012 | Beghelli |
| D667,983 S | 9/2012 | Pickard et al. |
| D672,911 S | 12/2012 | Mayfield, III |
| D673,324 S | 12/2012 | Mayfield, III |
| D673,711 S | 1/2013 | Pickard et al. |
| D675,364 S | 1/2013 | Watt |
| 8,348,481 B2 | 1/2013 | Chang |
| D677,820 S | 3/2013 | Mayfield et al. |
| D678,597 S | 3/2013 | Lehman et al. |
| D679,848 S | 4/2013 | Pickard et al. |
| D681,872 S | 5/2013 | Kong et al. |
| D697,652 S | 1/2014 | Savani |
| D698,975 S | 2/2014 | Blessitt et al. |
| D698,986 S | 2/2014 | Reynolds |
| D698,987 S | 2/2014 | Stanley |
| D699,386 S | 2/2014 | Park |
| D701,341 S | 3/2014 | Mayfield, III |
| D701,988 S | 4/2014 | Clements |
| D705,474 S | 5/2014 | Philips |
| D705,974 S | 5/2014 | Blessitt et al. |
| D707,873 S | 6/2014 | Boyer |
| 8,827,490 B2 | 9/2014 | Kim et al. |
| D730,556 S | 5/2015 | Toyohisa |
| D731,701 S | 6/2015 | Hargreaves |
| D732,233 S | 6/2015 | Reynolds |
| D735,391 S | 7/2015 | Blessitt |
| D735,401 S | 7/2015 | Clements |
| 9,110,216 B2 | 8/2015 | Blessitt |
| 9,121,580 B1 | 9/2015 | Bryant |
| 2002/0003698 A1 | 1/2002 | Engel |
| 2002/0141195 A1 | 10/2002 | Peter |
| 2003/0006353 A1 | 1/2003 | Dinh |
| 2003/0031011 A1 | 2/2003 | Miller et al. |
| 2007/0133193 A1 | 6/2007 | Kim |
| 2007/0230217 A1* | 10/2007 | Sakaki ................ G02B 6/0031 362/624 |
| 2008/0266905 A1 | 10/2008 | Yeh |
| 2008/0304288 A1 | 12/2008 | Iwasaki |
| 2009/0034241 A1 | 2/2009 | Coushaine et al. |
| 2009/0237958 A1 | 9/2009 | Kim |
| 2009/0316414 A1 | 12/2009 | Yang et al. |
| 2009/0323335 A1 | 12/2009 | Yang et al. |
| 2010/0002424 A1 | 1/2010 | Lin et al. |
| 2011/0051402 A1 | 3/2011 | Keller et al. |
| 2011/0176306 A1 | 7/2011 | Kim et al. |
| 2011/0205738 A1 | 8/2011 | Peifer et al. |
| 2011/0286239 A1 | 11/2011 | Wang et al. |
| 2012/0020109 A1 | 1/2012 | Kim et al. |
| 2012/0063138 A1 | 3/2012 | Leadford |
| 2012/0140461 A1 | 6/2012 | Pickard |
| 2012/0287671 A1* | 11/2012 | Parker .................... F21S 2/005 362/609 |
| 2012/0320627 A1 | 12/2012 | Araki et al. |
| 2013/0083539 A1 | 4/2013 | Dimitriadis |
| 2013/0083559 A1 | 4/2013 | Oh |
| 2014/0126243 A1 | 5/2014 | Blessitt |
| 2014/0254144 A1 | 9/2014 | Boomgaarden |
| 2014/0268766 A1 | 9/2014 | Lu |
| 2014/0313776 A1 | 10/2014 | Grigore |

(56) References Cited

U.S. PATENT DOCUMENTS

2015/0285489 A1 10/2015 Ulysse
2015/0288223 A1 10/2015 Sato

OTHER PUBLICATIONS

Fluorescent grow lamp, image post date Mar. 10, 2010, site visited Sep. 8, 2015, (online), <http://tineye.com/search/72e055653ffdb5ac977f7744676cf37c0660d3c8/>.

Light fixture, image post date Aug. 4, 2009, site visited Sep. 8, 2015, (online), <http://www.forum.grasscity.com/grow-room-designsetup/438239-buildin-my-lst-grow-box-html>.

Grow light wing reflector- TinEye, image post date Sep. 3, 2010, site visited Sep. 8, 2015, (online), <http://www.tineye.com/search/6da060cf87b652d7dfb5a3f4d0ede86abbe288d1/?pluginver=>.

Grid Ceiling Luminaires, image post date 2014, site visited Sep. 8, 2015, (online), <http://www.ledsmagazine.com/articles/print/volume-11/issue-9/features/focus-on-luminaires/ngl-indoor-competition-2014.html>.

European Search Report for EP 14770171.8 dated Nov. 16, 2016.

ZR Series High Efficacy Troffer, image post date Apr. 13, 2012, site visited Oct. 31, 2014 (online), <http://www.cree.com/lighting/products>.

NPL date for ZR Series High Efficacy Troffer from Wayback Machine, image post date Oct. 31, 2014, site visited Oct. 31, 2014, (online), <http://web.archive.org/web/20120415000000*/http://www.cree.com/lighting/products>.

Cree CR24, image post date Apr. 28, 2011, site visited Nov. 15, 2014, (online), <http://www.ledsmagazine.com/content/dam/leds/migrated/objects/news/8/4/19/cree204272011.jpg>.

NPL date for Cree CR24, image post date Apr. 28, 2011, site visited Nov. 15, 2014, (online), <http://ledsmagazine.com/articles/2011/04/cree-delivers-led-alternative-to-linear-fluorescent-fixtures.html>.

Cree AR Series Architectural LED Troffer, image post date Mar. 9, 2013, site visited Nov. 21, 2014, (online), <http://web.archive.org/web/20130309023733/http://www.cree.com/lighting/products/indoor/troffers/ar-series>.

International Search Report for PCT/US2014/026328, dated Aug. 28, 2014.

\* cited by examiner

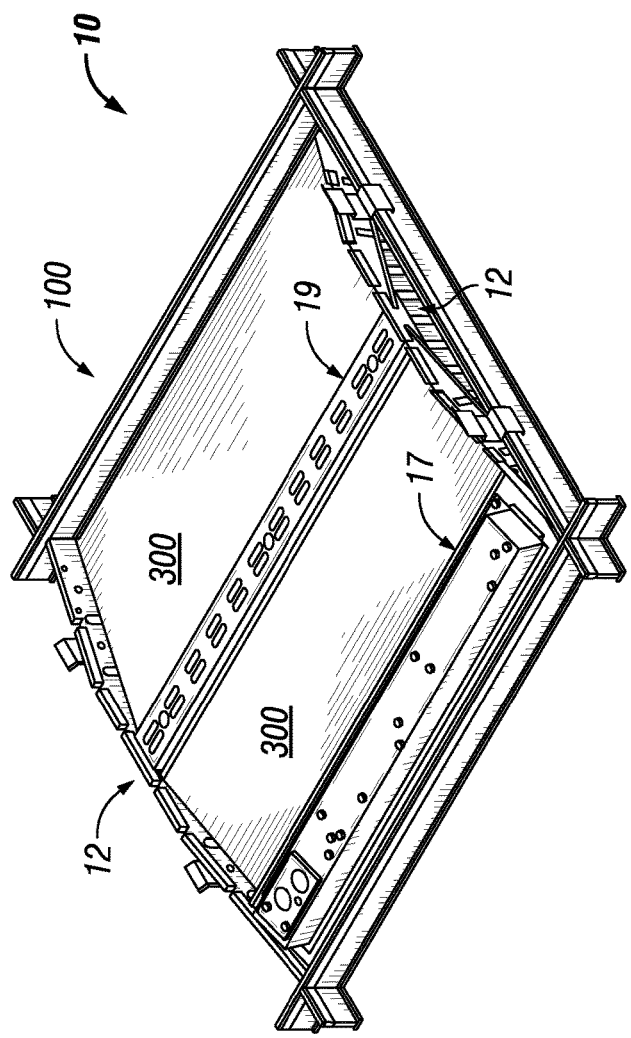
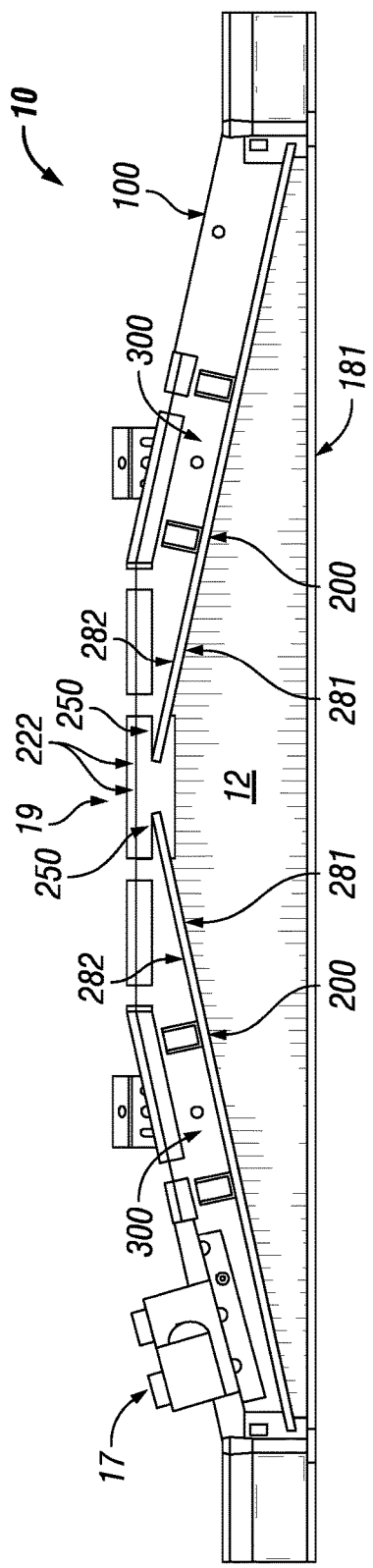
FIG. 1A
FIG. 1B

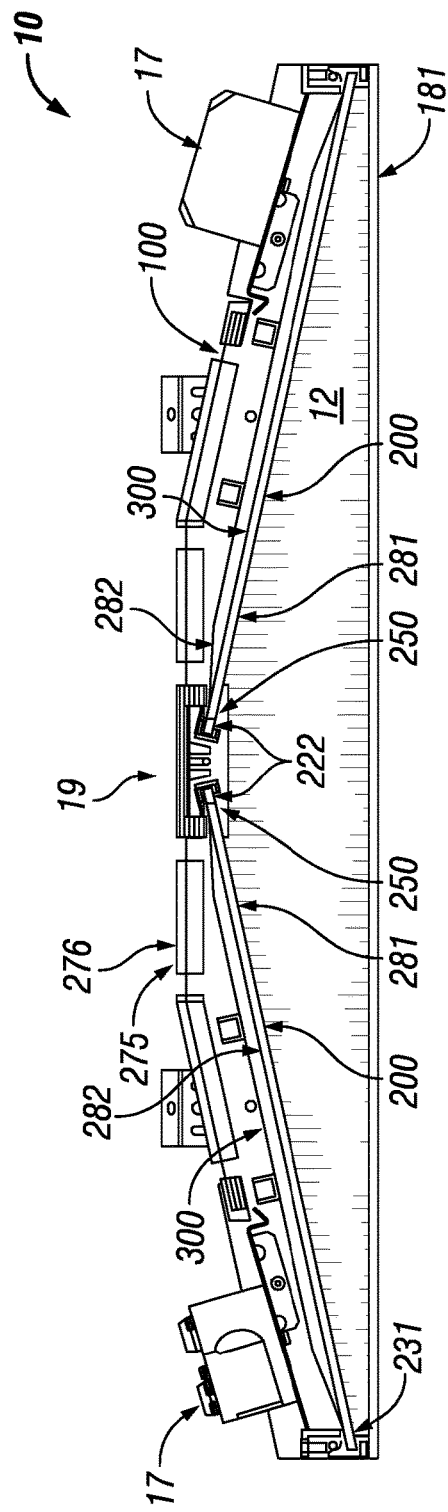
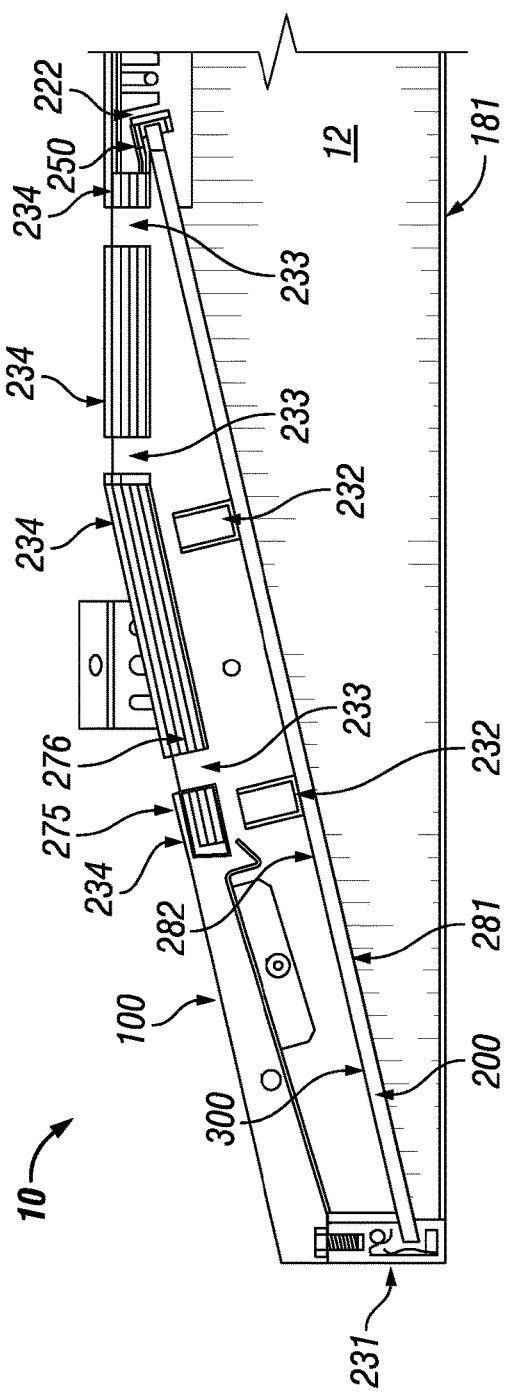

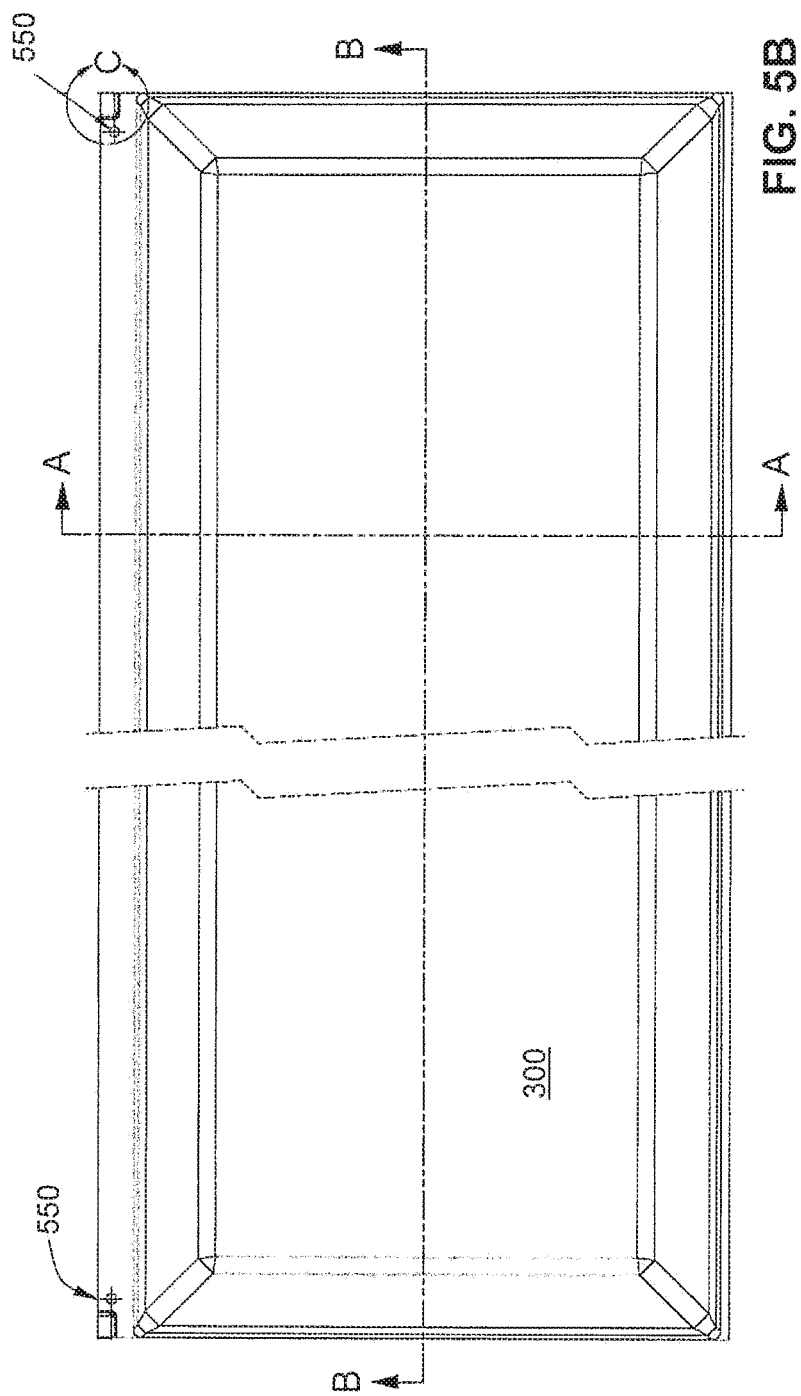

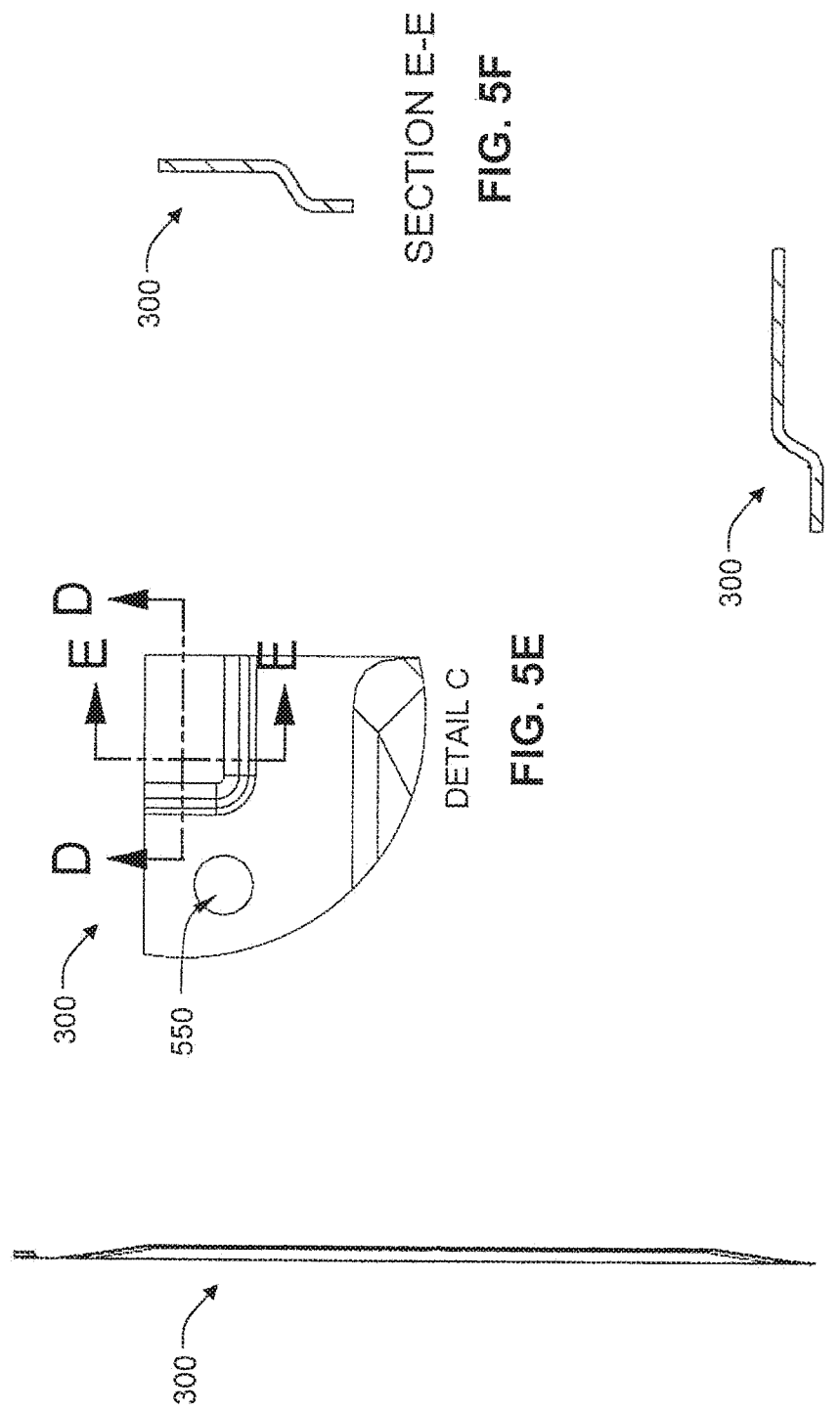

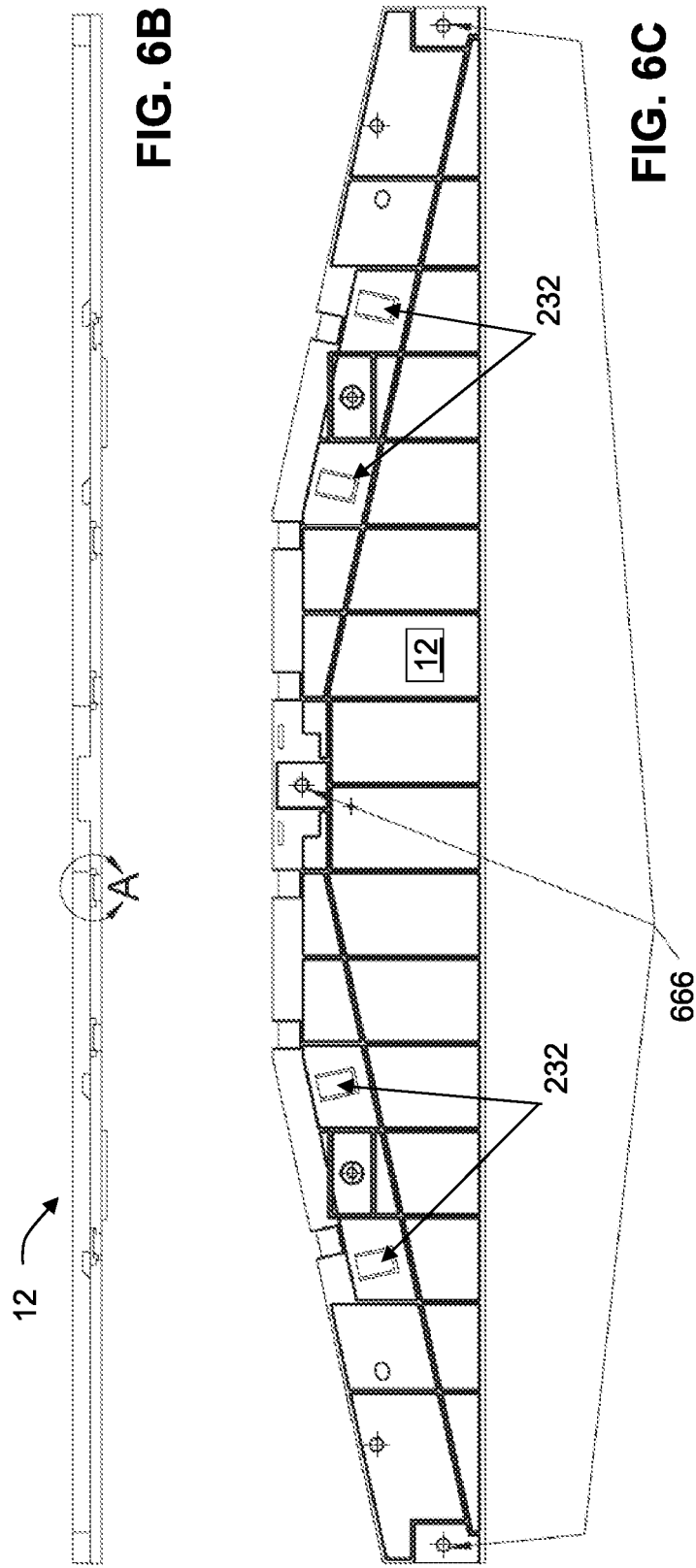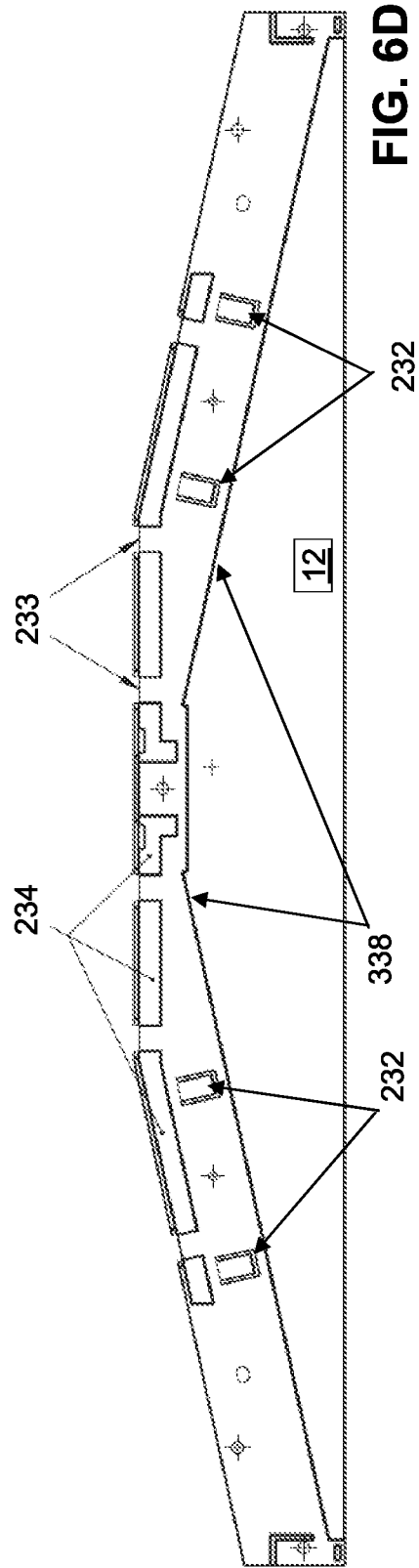

EDGELIT LIGHTING SYSTEM

CROSS REFERENCE TO RELATED APPLICATIONS

This application is a continuation application of and claims priority to U.S. Non-Provisional patent application Ser. No. 15/607,207, filed May 26, 2017, and titled "Edgelit Multi-Panel Lighting System," which is a continuation application of and claims priority to U.S. Non-Provisional patent application Ser. No. 13/832,095, filed Mar. 15, 2013, and titled "Edgelit Multi-Panel Lighting System," which issued as U.S. Pat. No. 9,666,744 on May 30, 2017. The entire contents of the foregoing application and patent are hereby incorporated herein by reference.

TECHNICAL FIELD

Embodiments described herein generally relate to lighting fixtures and, more particularly, to systems involving multiple edgelit lightguides.

BACKGROUND

With greater adoption of Light Emitting Diode (LED) light sources, new lighting systems have begun incorporating alternative means for casting, distributing, and reflecting light. While edgelit lighting systems are desirable for many applications, improved technologies are needed in order for edgelit systems to meet their full potential. Need is apparent for improvement in the fixtures that mount and provide power and other facilities for edgelit lighting systems. For example, need exists for improved wire management technology. As another example, need exists for improved mounting technologies for lightguides and associated reflectors. In this representative context, embodiments described herein relate to lighting systems, including edgelit systems involving edgelit lightguides.

SUMMARY

A lighting system can comprise at least two lightguides that each receives, guides, and distributes light. In certain embodiments, each lightguide can comprise a slab, plate, sheet, panel, or other piece of optical material that in outline may be rectangular, square, circular, triangular, or some other appropriate shape or geometric form. The piece of optical material can be flat, slightly curved, or have another appropriate profile or geometry. The lightguides can be mounted in a frame. A light source can couple light into one or more edges of the lightguides. The coupled light can propagate in the lightguides and emit from major surfaces of the lightguides, thereby distributing and spreading the light. In a typical application, one of the major surfaces of each lightguide faces away from an area to be illuminated, while the other major surface faces towards the area to be illuminated. Light emitted from the major surface that faces away from the area to be illuminated can be redirected towards the area to be illuminated by a reflective surface positioned next to that major surface. The reflective surface, which can be diffusely reflective, specularly reflective, or a combination of specularly and diffusely reflective, can be spaced slightly away from the lightguide. The space between the lightguide and the reflective surface can provide an air gap. The air gap can promote internal reflection at the major surface facing away from the area to be illuminated and further can enhance light uniformity or homogeneity in the area to be illuminated. Promoting internal reflection on the major surface facing away from the area to be illuminated can reduce the amount of light that emits from the lightguide in the "wrong" direction and needs to be redirected towards the area to be illuminated. The frame can comprise one or more channels for distributing or carrying electrical lines for supplying electrical power. The channels, which can function as wireways, can be integral with the frame, for example formed during molding or other appropriate frame fabrication process.

The foregoing discussion of lighting systems is for illustrative purposes only. Various aspects of the present technology may be more clearly understood and appreciated from a review of the following detailed description of the disclosed embodiments and by reference to the drawings and the claims that follow. Moreover, other aspects, systems, methods, features, advantages, and objects will become apparent to one with skill in the art upon examination of the following drawings and detailed description. It is intended that all such aspects, systems, methods, features, advantages, and objects are to be included within this description, are to be within the scope of the present technology, and are to be protected by the accompanying claims.

BRIEF DESCRIPTION OF THE FIGURES

Reference will be made below to the accompanying drawings, wherein:

FIGS. 1A and 1B (collectively FIG. 1) illustrate a lighting system according to some example embodiments. FIG. 1A illustrates a perspective view of the lighting system as assembled, while FIG. 1B illustrates an internal side of an endplate of the lighting system.

FIGS. 2A, 2B, and 2C (collectively FIG. 2) illustrate additional internal features of the lighting system illustrated in FIG. 1 according to some example embodiments. FIG. 2A illustrates internal portions of the lighting system, provided by removing an endplate of the lighting system to expose internal features. FIG. 2B illustrates an expanded view of the left-hand side of FIG. 2A. FIG. 2C illustrates a perspective view of the lighting system from an overhead vantage point that shows internal features of the lighting system.

FIG. 4 is similar to FIG. 2B, but depicting separation between a lightguide and a reflector of the lighting system to enhance illumination output in a desired direction.

FIGS. 5A, 5B, 5C, 5D, 5E, 5F and 5G (collectively FIG. 5) illustrate a reflector of the lighting system illustrated in FIG. 1 according to some example embodiments. FIG. 5A illustrates a perspective view. FIGS. 5B, 5C, and 5D illustrate orthogonal views. FIG. 5E illustrates a detail view. FIGS. 5F and 5G illustrate cross sectional views taken in the detail view of FIG. 5E.

FIGS. 6A, 6B, 6C, 6D, 6E, 6F, and 6G (collectively FIG. 6) illustrate an endplate of the lighting system illustrated in FIG. 1 according to some example embodiments. FIG. 6A illustrates a perspective view. FIGS. 6B, 6C, 6D, and 6E illustrate orthogonal views. FIG. 6F illustrates a detail view. FIG. 6G illustrates a cross sectional view taken in the detail view of FIG. 6F.

Figure 2C:
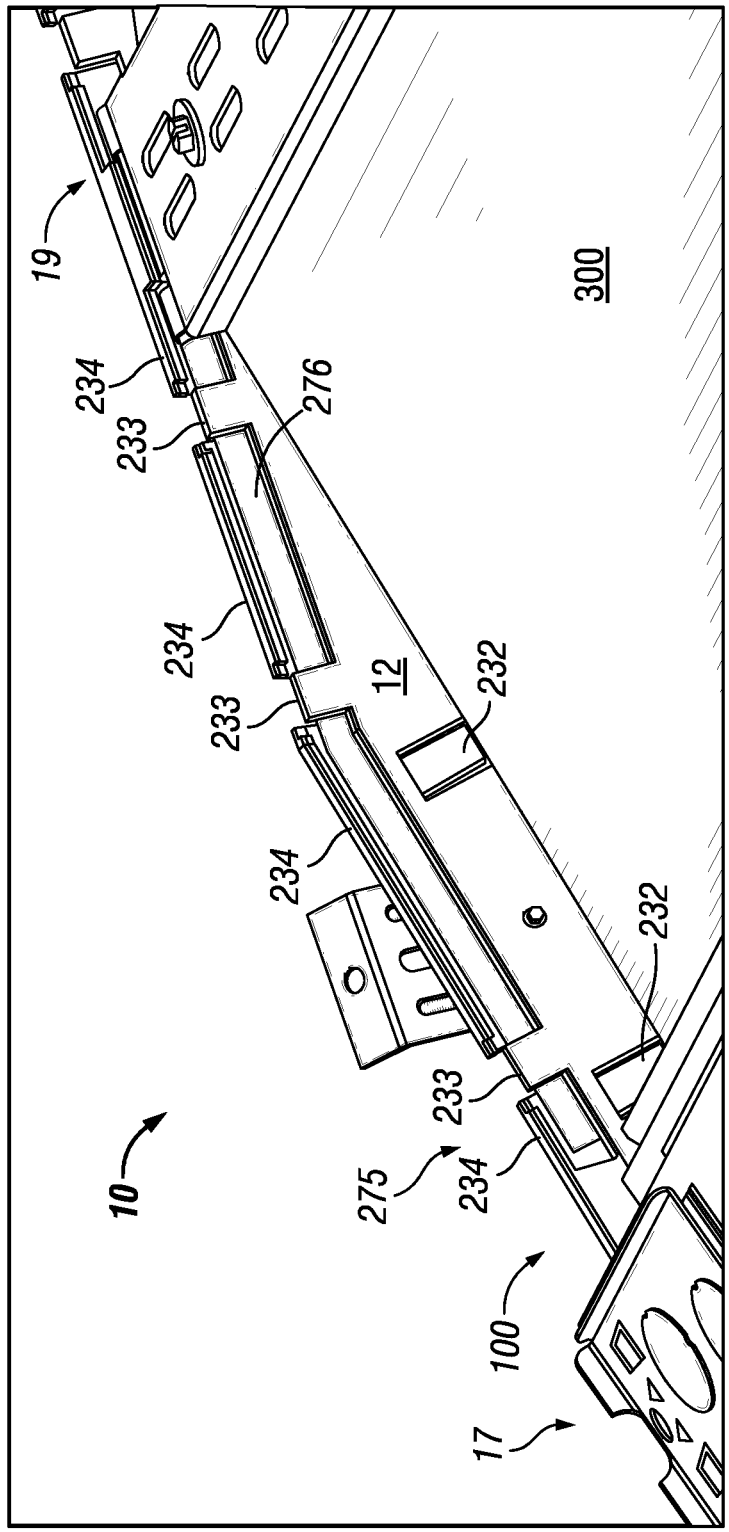

Many aspects of the technology can be better understood with reference to these drawings. The elements and features shown in the drawings are not necessarily drawn to scale, emphasis instead being placed upon clearly illustrating the principles of exemplary embodiments of the present technology. Moreover, certain dimensions may be exaggerated to help visually convey such principles. In the drawings, reference numerals designate like or corresponding, but not necessarily identical, elements throughout the several views.

DETAILED DESCRIPTION OF EXAMPLE EMBODIMENTS

A lighting system can comprise a light source and an element that receives, transmits, and emits light produced by the light source. In certain embodiments, the light source comprises one or more light emitting diodes. In certain embodiments, the element that receives, transmits, and emits light comprises a lightguide. The lightguide may have a generally planar format as may be provided with a slab, plate, sheet, or panel of optical material, for example. A frame may position such light emitting diodes beside an edge of the lightguide, and the lightguide may emit light in a beneficial direction as well as in an opposing direction. A reflective element positioned at a standoff distance from the lightguide may redirect the light that is emitted in the opposing direction, causing it to head in the beneficial direction. An air gap associated with the standoff distance may reduce the amount of light that the lightguide emits in the opposing direction, so that less light needs redirection. The air gap can further enhance homogeneity of the lightguide as viewed by someone in an illuminated area, for example avoiding a spotted or wetted appearance. In certain embodiments, the frame may have one or more built-in channels that serve as wireways for routing wires that supply electrical power to the lighting system.

The present technology can be embodied in many different forms and should not be construed as limited to the embodiments set forth herein; rather, these embodiments are provided so that this disclosure will be thorough and complete, and will fully convey the scope of the technology to those having ordinary skill in the art. Furthermore, all "examples" or "exemplary embodiments" given herein are intended to be non-limiting and among others supported by representations of the present technology.

Turning now to the figures, a lighting system 10 according to some example embodiments is illustrated in FIG. 1. FIG. 1A provides a perspective view. FIG. 1B shows an internal side of an endplate 12 of the lighting system 10 along with representative adjoining elements.

As illustrated, the example lighting system 10 comprises two lightguides 200, each with an associated reflector 300, that are held in position by a frame 100. The frame 100 comprises two endplates 12, with a wireway bracket 17 and a reflector clamp bracket 19 extending between the two endplates 12. In additional to its structural role, the wireway bracket 17 provides a wireway for electrical supply lines. In addition to its structural role, the reflector clamp bracket 19 pulls heat associated with the lighting system 10 generating light and dissipates the heat.

A respective line of light emitting diodes 222 extends along an edge 250 of each of the two lightguides 200. In some embodiments, reflective tape is applied to edges of each lightguide that do not have adjacent light emitting diodes 222. Light emitting diodes 222 provide an example of a light source; however, in some embodiments, other appropriate light sources may be substituted. The light emitting diodes 222 emit light into the lightguides 200, and the light propagates in the two lightguides 200 guided by total internal reflection between two major surfaces 281, 282 of the lightguides 200. While light that is emitted into the lightguides 200 at relatively shallow angles undergoes total internal reflection, light at steeper angles spills through the major surfaces 281, 282.

The major surfaces 281 of the two lightguides 200 are oriented by the frame 100 for illuminating an area to be illuminated, while the major surfaces 282 are oriented away from the area to be illuminated. Thus, when the lighting system 10 is installed, light emitting through the major surfaces 281 provides beneficial illumination, while light emitting through the major surfaces 282 is in the opposite direction for providing beneficial illumination. The reflectors 300 redirect the light that is headed in the wrong direction so that the redirected light can provide beneficial illumination.

The lighting system 10 may be installed above or otherwise adjacent an area to be illuminated. The installation may involve replacement of one or more drop-in panels of a suspended ceiling, recess in ceiling or a wall, or mounting to a surface of a wall or ceiling or other appropriate structure, for example. Thus in operation, the lighting system 10 can illuminate an area by emitting light outward from the major surfaces 281 of the lightguides 200, including light that reflects off the reflectors 300. Light from light emitting diodes 222 adjacent a vertex of the lighting system 10 transmits into an edge 250 of the lightguides 200 and scatters, distributes, and/or reflects off the reflector 300, and emits from the major surfaces 281 of the lightguides 200. More specifically, the coupled light from the light emitting diodes 222 propagates along the lightguides 200 guided by total internal reflections off the major surfaces 281, 282 of the lightguides 200. Portions of the light incident to the major surfaces 281, 282 transmit through those surfaces 281, 282. Light transmitting through the major surface 281 is distributed to an area to be lit, for example a room. Light transmitting through the major surface 282 is directed back through the lightguide 200 by the reflector 300, for ultimate emission through the major surface 281 as beneficial illumination.

In certain example embodiments, each reflector 300 comprises a mirror or specularly reflective surface. In certain embodiments, each reflector 300 comprises a diffusely reflective surface such as a surface coated with flat white paint. In certain example embodiments, each reflector 300 is treated with a power coating or a matte powder paint. In certain example embodiments, each reflector 300 is faceted or comprises a surface relief pattern or other features that promote directionality of light reflection. In certain example embodiments, the reflectors 300 are curved or domed and are highly reflective. As will be discussed in further detail below and depicted in other figures, an air gap between each reflector 300 and its associated lightguide 200 reduces light transmission through the lightguide's major surface 282 and thus increases light output from the lightguide's major surface 281.

In various embodiments, the lighting system 10 may vary in shape and size. For example, although the lighting fixture 10 illustrated in FIG. 1 has a footprint or outline that is approximately square, lighting fixtures of triangular, square, rectangular, polygonal, circular, or other appropriate shapes are within the scope and spirit of the embodiments described herein. The lighting system 10 may be formed from various types of suitable materials. In some exemplary embodiments, the frame 100 is formed from a combination of plastic and metal, and the lightguides 200 are formed from a plastic, polymer, acrylic, glass, or other suitable material and may include reinforcements such as glass. In the example embodiment of FIG. 1, the endplates 12 can be made of plastic via molding, and the wireway bracket 17 and reflector clamp bracket 19 can comprise aluminum or other suitable metal or rigid material. In some embodiments, one or both of the wireway bracket 17 and the reflector clamp bracket 19 comprise aluminum extrusions. Thus, the frame 100 and its components can support/enclose the lightguides 200.

In the illustrated example embodiment, elements of the lighting system 10 are arranged in a polyhedron. The lightguides 200 form two faces of the polyhedron, meeting in vertex at the apex of the lighting system 10. In the illustrated example embodiment, the two lightguides 200 converge in an obtuse angle. The endplates 12 form two additional faces of the polyhedron. A fifth face of the polyhedron is provided by the aperture 181 of the lighting system 10, which is the portion of the lighting system 10 that emits light into the area to be illuminated. Thus, the outline or footprint of the lighting system can provide a fifth polyhedron face opposite the vertex formed between the two lightguides 200.

Referring now to FIG. 2, this figure illustrates additional internal features of the lighting system 10 illustrated in FIG. 1 according to some example embodiments. FIG. 2A provides an internal view of the lighting system 10, provided by removing one of the two endplates 12 of the lighting system 10 to expose representative internal features. FIG. 2B illustrates an expanded view of the left-hand side of FIG. 2A with additional elements removed to benefit the view. FIG. 2C illustrates a overhead perspective view of the lighting system 10 that shows internal features of the lighting system 10.

Figure 3:
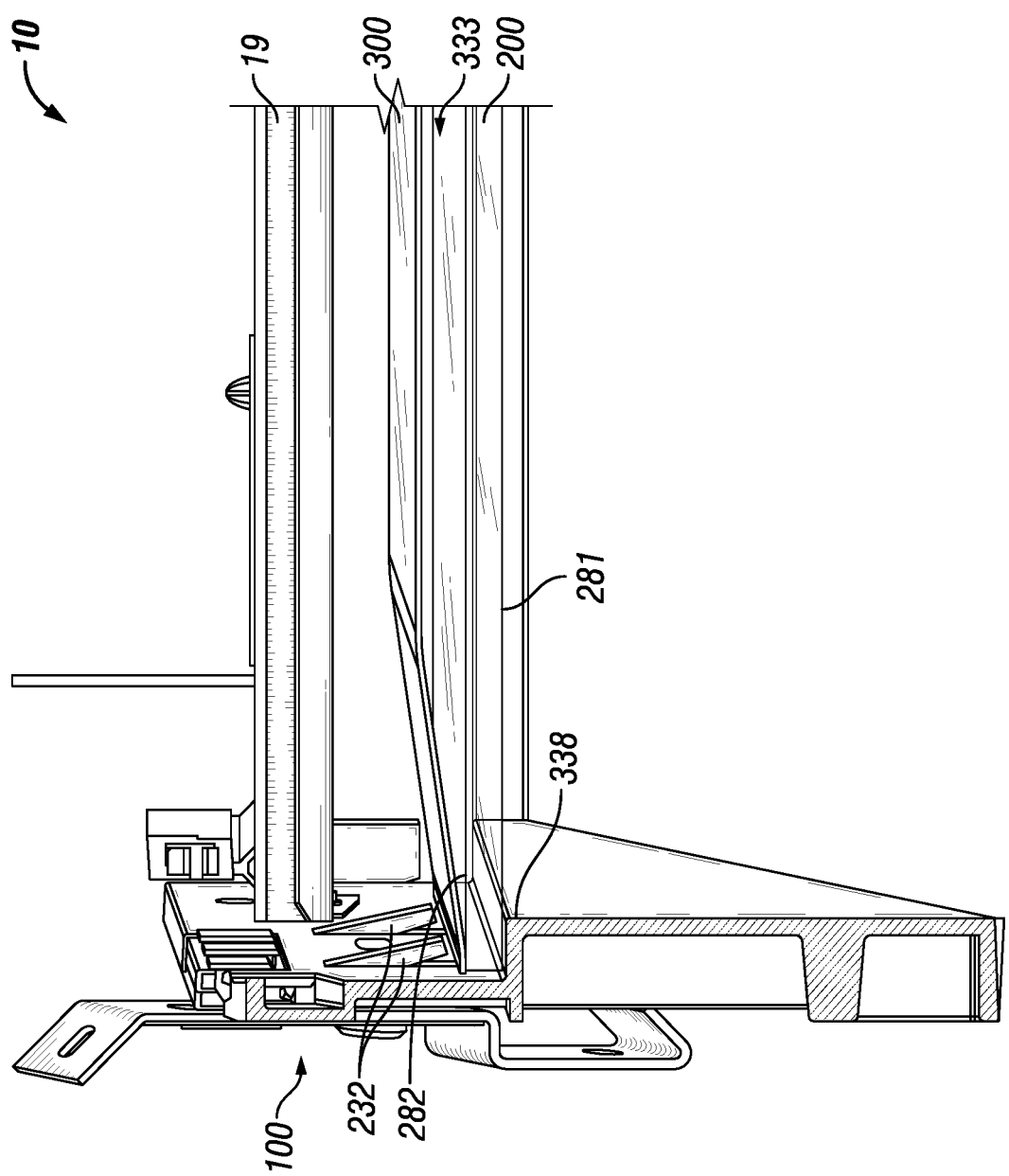
FIG. 3 illustrates another internal view of the lighting system illustrated in FIG. 1 according to some example embodiments. For the view of FIG. 3, the lighting system is cut between the two endplates (with only one endplate shown, in cross section), and the result is shown in perspective.
Figure 4:
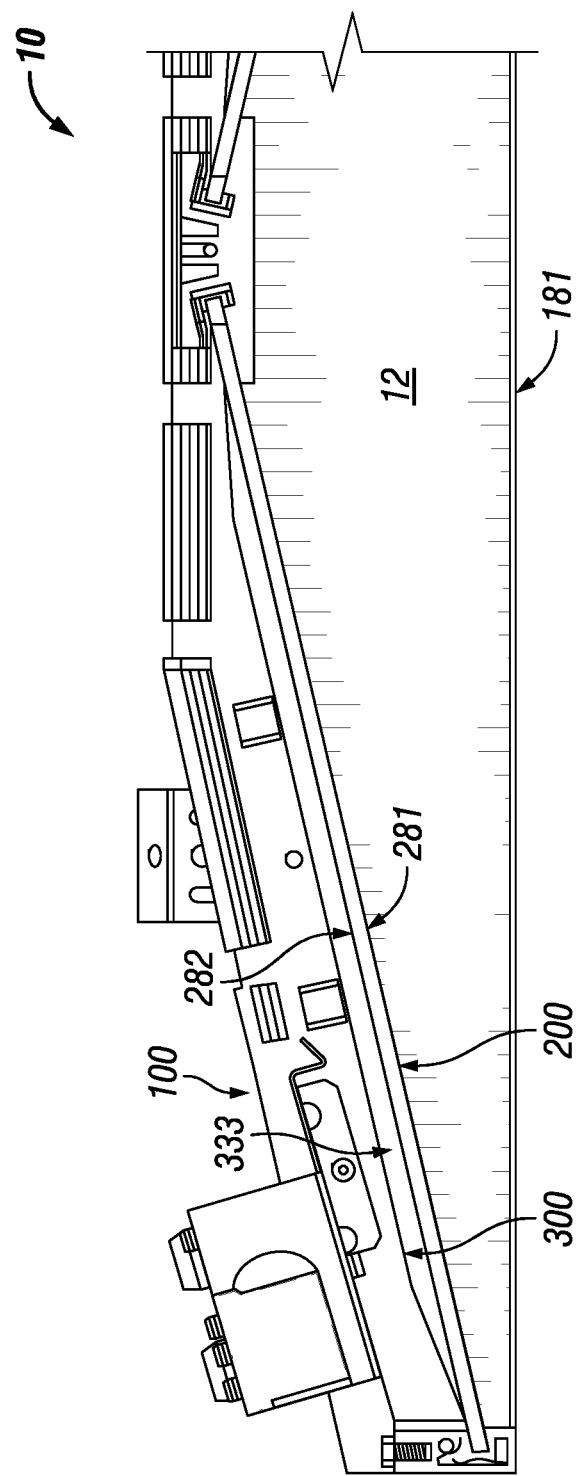
FIG. 4 illustrates another internal view of the lighting system illustrated in FIG. 1 according to some example embodiments.

FIG. 2A depicts the reflector 300 raised above the lightguide 200 to provide an air gap for enhancing reflection off the outwardly facing major surface 281 of the lightguide 200 as discussed above and as described in further detail below. As best shown in FIGS. 2B and 2C, the endplates 12 comprise reflector and waveguide restraints 232 for restraining the reflectors 300 and the waveguides 200 in the frame 100. For each reflector 300, the restraints 232 are positioned along the reflector edges to urge the reflector edge against the adjoining waveguide edge. As shown in FIG. 3, the reflector edge, in turn, is urged against an adjoining shoulder 338 of the frame 100. In the illustrated example embodiment, each restraint 232 comprises a flap of material on the frame 100 that is angled inward, over the adjoining edges of the reflector and waveguide 200. In the illustrate embodiment, the flap is an integral and seamless part of the frame 100. In other embodiments, the flap may be fastened to the frame 100 using adhesive, screws, rivets, or another appropriate means. Accordingly, the waveguide edge is sandwiched between the shoulder 338 of the frame 100 and the reflector edge. As depicted in FIGS. 3 and 4 and discussed below, portions of the reflector 300 that are away from the reflector edges are raised so that an air gap 333 is provided between a majority of the reflector's surface area and the lightguide 200.

As shown in FIG. 2B, the lighting system 10 further comprises a spring system 231 for urging each lightguide 200 towards its associated light emitting diodes 222. The spring system 231 promotes coupling of light into the waveguides 200 and relaxes tolerances to realize economical and fabrication benefits. Various example embodiments of the spring system 231 as well as various embodiments of light sources and technology for aligning light emitting diodes to waveguide edges are disclosed in U.S. patent application Ser. No. 13/788,827 entitled "Edgelit Lighting Fixture and Assembly" that was filed on Mar. 7, 2013 in the name of James Blessitt, Russ Clements, and Ellis Patrick, the entire contents of which are hereby incorporated herein by reference. Embodiments of the lighting system 10 can comprise one or more of the various technologies, systems, and elements disclosed in U.S. patent application Ser. No. 13/788,827.

FIG. 2 further illustrates a wire management system 275 that is integrated with the frame 100. The wire management system 275 routes electrical lines 276 that supply electrical power for the light emitting diodes 222. In the illustrated example embodiment, the electrical lines 276 comprise individually insulated electrical conductors or wires. The wire management system 275 maintains the electrical lines 276 in a linear array, as illustrated.

Figure 6A:
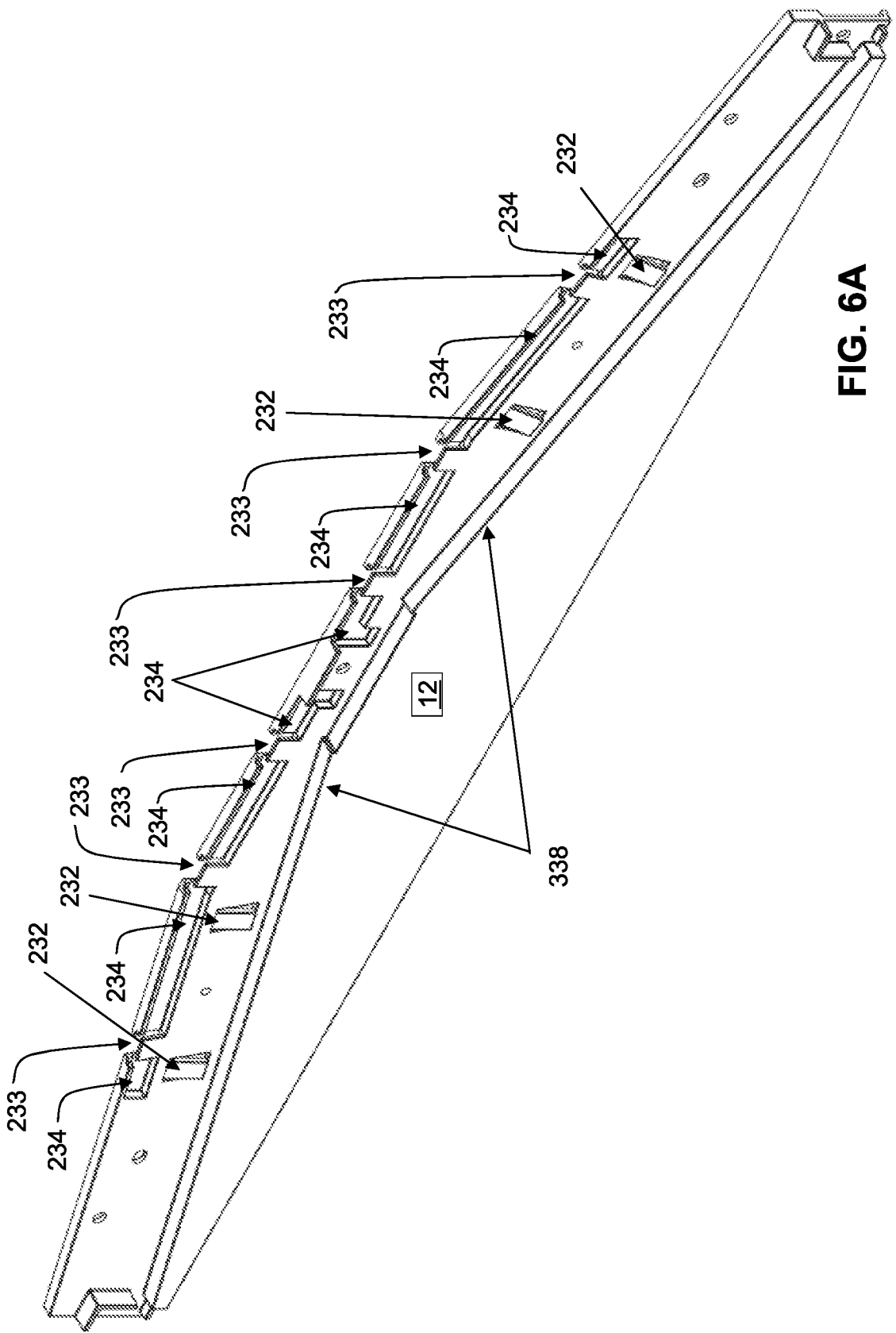

The illustrated wire management system 275 provides a channel that extends along an upper edge of the endplate 12. Segments of the channel are located on the inward facing side of the endplate 12, which is visible in FIGS. 2A, 2B, 2C, 6A, and 6D. Other segments of the channel are located on the outward facing side of the endplate 12, which is shown in FIG. 6C. More specifically, the inward facing side comprises recessed regions 234 in which the electrical lines 276 extend lengthwise next to one another. Tabs 233 are located between the recessed regions, and the electrical lines 276 extend on the outward facing side of the endplate 12 at those tabs 233. Thus, the electrical lines 276 continue "behind" the tabs from perspective of FIGS. 2A, 2B, and 2C. Accordingly, the channel and the electrical lines 276 oscillate or weave between sides of the endplate 12 and thus sides of the frame 100. Openings or slots are provided at the transitions between sides of the endlate 12 to facilitate lacing the electrical lines 276 into the channel.

Referring now to FIG. 3, this figure illustrates another internal view of the lighting system 10 illustrated in FIG. 1 according to some example embodiments. In FIG. 3, the lighting system 10 is shown in perspective as cut between the two endplates 12. FIG. 3 depicts the shoulder 338 and the retainers 232 capturing the edges of the lightguide 200 and the reflector 300. FIG. 3 further illustrates an example embodiment of the reflector 300 having a concave reflective surface that provides an air gap 333 for promoting internal reflection at the major surface 281 of the lightguide 200.

Referring now to FIG. 4, this figure illustrates another internal view of the lighting system 10 illustrated in FIG. 1 according to some example embodiments. The view of FIG. 4 is similar to that of FIG. 2B, but emphasizing example separation between the lightguide 200 and the reflector 300 of the lighting system 10. The separation enhances illumination output in a desired direction as discussed above. The separation further helps avoid a spotty or wetted appearance that may result from intermittent, uncontrolled contact between the reflector 300 and the lightguide 200. As illustrated in FIG. 4, the major surface 282 of the lightguide 200 contacts the reflector 300 at a perimeter of the lightguide 200. In the illustrated example embodiment, contact is limited to the edges of the lightguide 200 to avoid or limit frustration of total internal reflection at the major surface 282. The shoulder 338 of the frame 100 (illustrated in FIG. 3) essentially limits contact to portions of the lightguide 200 that are hidden from the view of a person located in an area illuminated by the lighting system 10.

Figure 5A:
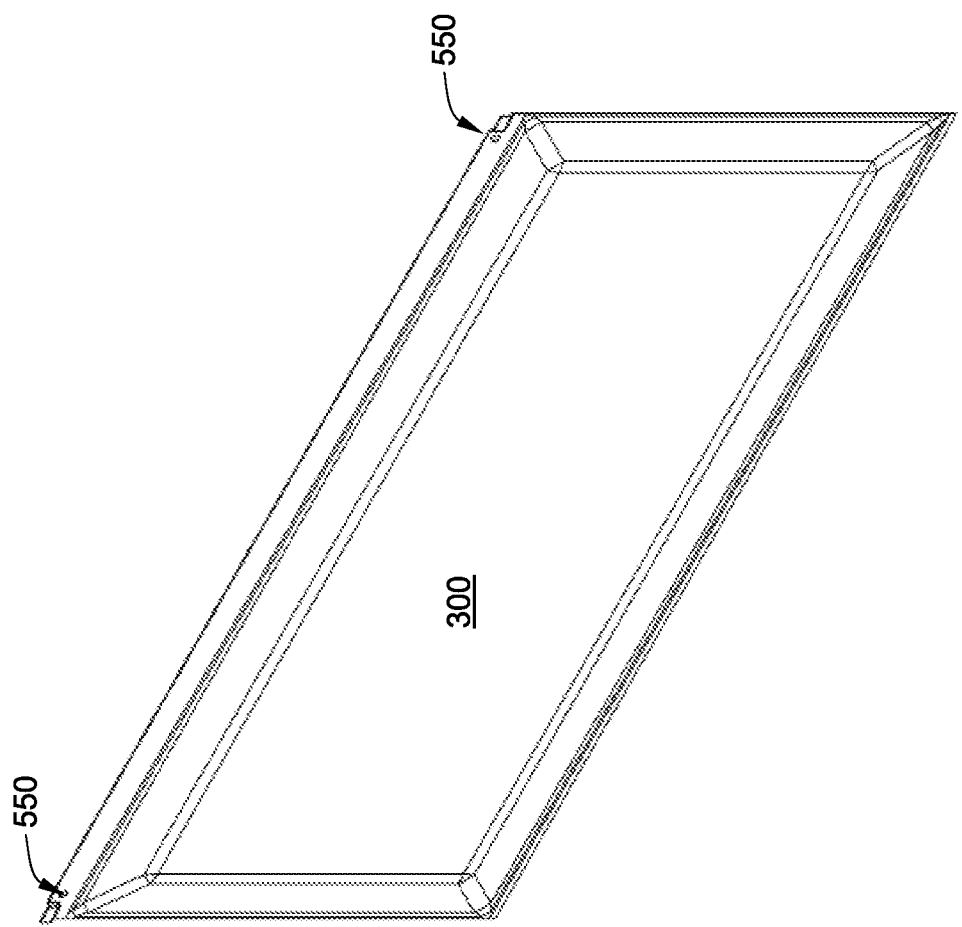

Referring now to FIG. 5, this figure illustrates a reflector 300 of the lighting system 10 illustrated in FIG. 1 according to some example embodiments. FIG. 5A illustrates a perspective view. FIGS. 5B, 5C, and 5D illustrate orthogonal views. The view of FIG. 5C is taken at section B-B as indicated on FIG. 5B, while the view of FIG. 5D is taken at section A-A as indicated on FIG. 5B. FIG. 5E illustrates a detail view taken in the area of FIG. 5B denoted "C." FIGS. 5F and 5G illustrate cross sectional views taken in the detail view of FIG. 5D. FIG. 5F is taken at indicated section D-D, while FIG. 5G is taken at indicated section E-E.

In the illustrated embodiment, the reflector 300 comprises holes 550 for hanging the reflector 300 during fabrication, specifically while the reflector is powder coated. In some example embodiments, the reflector 300 comprises a matte white material for diffuse reflectance. In some example embodiments, the reflector 300 provides specular reflectance, such as via a mirrored metallic coating. In some example embodiments, the reflector 300 is embossed. In some embodiments, the reflector 300 is formed of embossed metal. In some embodiments, the reflector 300 is dish-shaped and formed from a thin sheet of metal. In some embodiments, the reflector has a matte powder that provides a rough surface that avoids a wetted appearance. In some embodiments, the reflector 300 reflects light using a combination of specular and diffuse reflection. As discussed above, the illustrated example reflector 300 is concave to limit contact between the reflector 300 and the lightguide 200.

Referring now to FIG. 6, this figure illustrates an endplate of the lighting system 10 illustrated in FIG. 1 according to some example embodiments. FIG. 6A illustrates a perspective view. FIGS. 6B, 6C, 6D, and 6E illustrate orthogonal views.

FIG. 6C illustrates a grounding circuit 666 that is integrated with the endplate 12 to provide grounding to metal components of the frame 100 via physical contact that provides electrical connectivity. The grounding circuit 666 may be embedded in the endplate 12 by positioning one or more electrically conductive wires or electrical traces in a cavity of a mold for the endplate 12 and then injecting molten plastic in the cavity. When the solidified plastic is removed from the mold, the grounding circuit 666 is formed within the endplate 12.

Figure 6F:
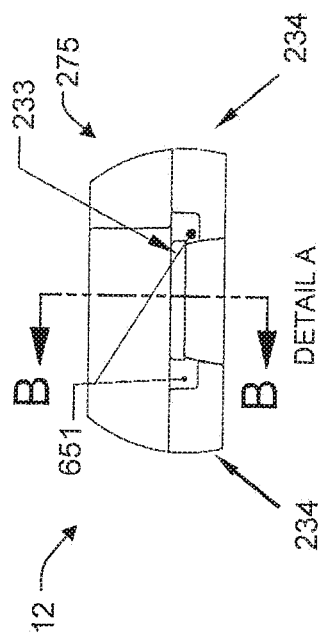

FIG. 6F illustrates a detail view of the endplate 12 that is taken at the area of FIG. 6B denoted "A" and that describes an example embodiment of the wire management system 275. The detail view of FIG. 6F illustrates the tab 233 and the openings 651 for lacing the electrical lines 276 into the channel of the wire management system 275.

Figure 6G:
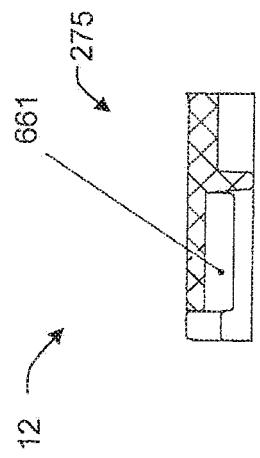
Figure 6E:
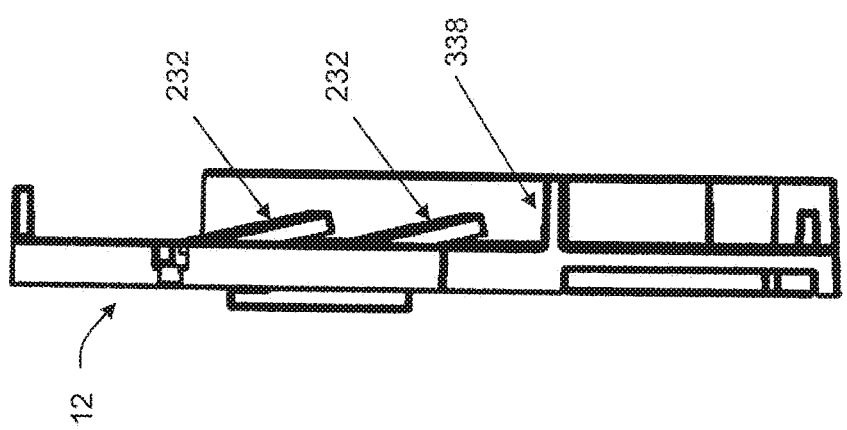

FIG. 6G illustrates a cross sectional view taken in the detail view of FIG. 6F at indicated section B-B. FIG. 6G further illustrates the wire management system 275, depicting the channel 661 of the wire management system 275 in cross section.

Figure 7:
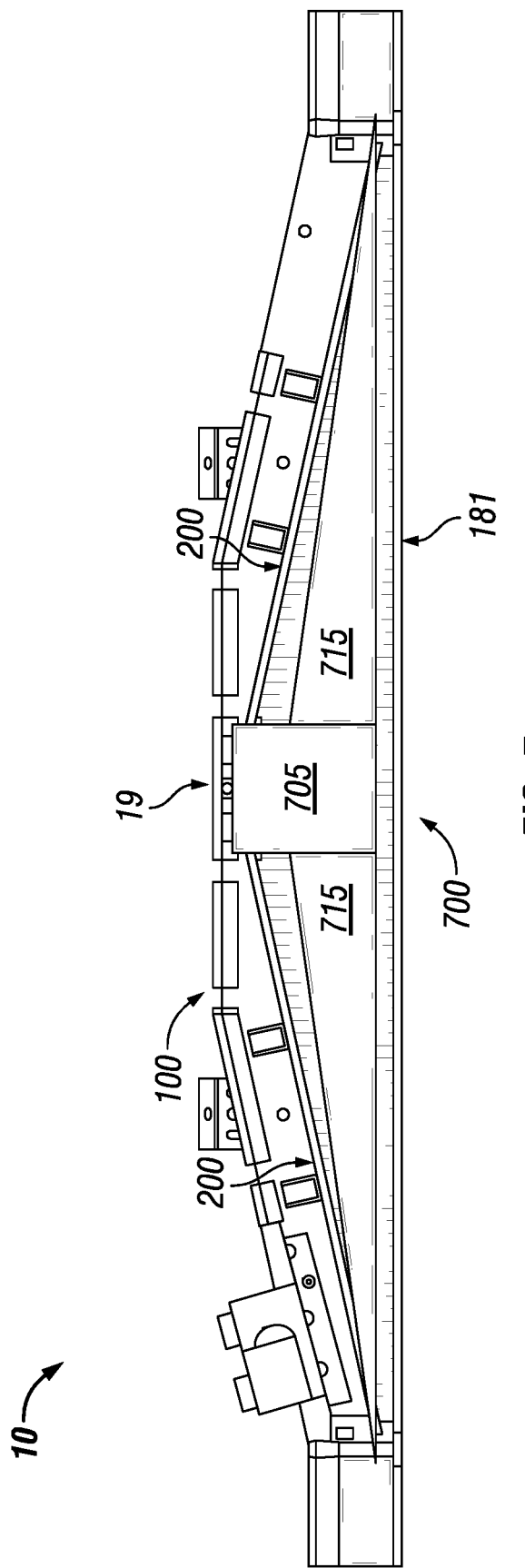
FIG. 7 illustrates packaging for the lighting system illustrated in FIG. 1 according to some example embodiments.

FIG. 7 illustrates packaging for the lighting system 10 illustrated in FIG. 1 according to some example embodiments. In the illustrated embodiment, the packaging system 700 comprises three packaging pieces 705, 715 that are fitted within the lighting system 10 via the aperture 181. Two of the packaging pieces 715 are wedge-shaped and are located below the two waveguides 200. A third packaging piece 705 is block-shaped and is located under the reflector clamp bracket 19.

The packaging pieces 705, 715 may be formed of foam, cardboard, or other appropriate material and collectively or individually coated with plastic film. In some embodiments, the three packaging pieces 705, 715 are combined into one piece. Such a combination may be formed by a unitary molding of foam. Alternatively, the three packaging pieces 705, 715 may be formed individually via molding or other appropriate process and then joined together using adhesive, for example.

In some example embodiments, the packaging system 700 comprises one or more thermoformed plastic inserts with a molded handle. The thermoformed insert(s) can be clear so that the lighting system may be operated and provide illumination during construction, and the insert removed after construction activities are completed.

In addition to protecting the lighting system 10 during shipment, the packaging system 700 facilitates installation of the lighting system 10 without installation personnel needing to touch the lightguides 200. An installer can mount the lighting system 10 overhead while the packaging pieces 705, 715 remain in the aperture 181, thus avoiding risk of marring the lightguides 200.

Once the lighting system 10 is mounted, the installer can readily remove the packaging pieces 705, 715. In situations where constructions activities are ongoing at a site, the packaging pieces 705, 715 can remain in the aperture 181 after mounting. After construction tasks are complete, the packaging pieces 705, 715 may be removed from the aperture 181. In this manner, the lighting system 10 remains clean and avoids accumulation of dust and debris associated with sawing and other typical construction site activities.

Technology for lighting systems has been described. From the description, it will be appreciated that an embodiment of the present technology overcomes the limitations of the prior art. Those skilled in the art will appreciate that the present technology is not limited to any specifically discussed application or implementation and that the embodiments described herein are illustrative and not restrictive. From the description of the exemplary embodiments, equivalents of the elements shown therein will suggest themselves to those skilled in the art, and ways of constructing other embodiments of the present technology will appear to practitioners of the art. Therefore, the scope of the present technology is to be limited only by the claims that follow.

What is claimed is:

1. A lighting system comprising:
   a frame adapted to be recess mounted in a ceiling, the frame comprising a first endplate with a first shoulder and a second endplate with a second shoulder;
   a lightguide disposed on and extending between the first shoulder and the second shoulder, the lightguide comprising:
   a first major surface;
   a second major surface extending parallel to the first major surface; and
   an edge formed between the first and second major surfaces;
   a light source disposed along the edge to couple light into the lightguide through the edge;
   a reflector that is positioned adjacent the first major surface of the lightguide to reflect the light from the light source that exits the lightguide through the first major surface such that the light that is reflected reenters the lightguide through the first major surface, wherein an air gap separates a portion of the reflector from a portion of the first major surface of the lightguide while a remainder portion of the reflector adjoins the first major surface adjacent a perimeter of the first major surface of the lightguide,
wherein the reflector is substantially concave such that the air gap is wider at a middle portion of first major surface than adjacent the perimeter of the first major surface;
a second lightguide disposed on and extending between the first shoulder and the second shoulder, the second lightguide comprising a second edge,
a second light source disposed along the second edge to couple second light into the second lightguide through the second edge.

2. The lighting system of claim 1, wherein the first shoulder and the second shoulder support the lightguide and the second lightguide such that the lightguide and the second lightguide meet in a vertex at an apex of the lighting system.

3. The lighting system of claim 1, wherein the frame comprises an integral wiring channel and an integral grounding trace, and wherein the integral grounding trace is formed and disposed within the first endplate of the frame.

4. The lighting system of claim 1,
wherein, in operation, the light propagates in the lightguide guided by total internal reflection between the first and second major surfaces,
wherein, in operation, the second light propagates in the second lightguide guided by total internal reflection between a third major surface and a fourth major surface of the second lightguide.

5. The lighting system of claim 2, wherein the lightguide and the second lightguide extend downward relative to the apex.

6. The lighting system of claim 3, further comprising a plurality of electrical lines that are configured to supply electricity to the light source and the second light source, wherein the plurality of electrical lines are supported by the integral wiring channel formed in the frame.

7. The lighting system of claim 3, wherein the integral wiring channel is formed on a top edge of the first endplate.

8. A lighting system comprising:
a frame that defines an opening for emitting light towards an area to be illuminated and comprising a first pair of shoulders and a second pair of shoulders;
a first lightguide disposed on the first pair of shoulders and comprising a first edge formed between a first major surface and a second major surface;
a first light source disposed along the first edge to couple light into the first lightguide through the first edge;
a second lightguide disposed on the second pair of shoulders and comprising a second edge formed between a third major surface and a fourth major surface;
a second light source disposed along the second edge to couple light into the second lightguide through the second edge;
wherein the first pair of shoulders and the second pair of shoulders of the frame support the first lightguide and the second lightguide, respectively, such that the first lightguide and the second lightguide meet in a vertex at an apex of the lighting system;
a clamp bracket that is disposed at the apex of the frame and configured to dissipate a heat generated by the lighting system; and
a packaging assembly that is disposed in the lighting system such that a first segment of the packaging assembly and a second segment of the packaging assembly are positioned below the first lightguide and the second lightguide, respectively, while a third segment of the packaging assembly that is positioned between the first segment and the second segment is disposed below the clamp bracket,
wherein the packaging assembly is configured to protect the lighting system during shipment and installation, and
wherein the packaging assembly is configured to be removed through the opening once the lighting system is installed.

9. The lighting system of claim 8, wherein the packaging assembly is formed using foam and is coated with a plastic film.

10. The lighting system of claim 8, wherein the packaging assembly comprises clear thermoformed plastic inserts with a molded handle.

11. The lighting system of claim 8, wherein the first segment and the second segment of the packaging assembly are wedge shaped, while the third segment of the packaging assembly is block shaped.

12. The lighting system of claim 1, wherein the frame further comprises a reflector clamp bracket securing the reflector and extending from the first endplate to the second endplate.

* * * * *